US012604627B2

(12) United States Patent
Jang et al.

(10) Patent No.: US 12,604,627 B2
(45) Date of Patent: Apr. 14, 2026

(54) METHOD OF MANUFACTURING AN ORGANIC LIGHT-EMITTING DISPLAY DEVICE INCLUDING FORMING THE PIXEL DEFINER BY MELTING THE PIXEL DEFINER MATERIAL LAYER PATTERNED ON THE PIXEL ELECTRODE PATTERN

(71) Applicant: SAMSUNG DISPLAY CO., LTD., Yongin-si (KR)

(72) Inventors: Jae Hyuk Jang, Seongnam-si (KR); Joo Sun Yoon, Seoul (KR); Seung Min Lee, Jeju-si (KR); Yong Jae Jang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 11 days.

(21) Appl. No.: 17/067,696

(22) Filed: Oct. 11, 2020

(65) Prior Publication Data

US 2021/0029446 A1      Jan. 28, 2021

Related U.S. Application Data

(62) Division of application No. 15/356,755, filed on Nov. 21, 2016, now abandoned.

(30) Foreign Application Priority Data

Apr. 12, 2016      (KR) ........................ 10-2016-0044914

(51) Int. Cl.
| | |
|---|---|
| *H10K 59/12* | (2023.01) |
| *H04R 1/28* | (2006.01) |
| *H04R 1/34* | (2006.01) |
| *H10K 59/122* | (2023.01) |
| *H10K 59/131* | (2023.01) |

(Continued)

(52) U.S. Cl.
CPC ....... *H10K 59/1315* (2023.02); *H04R 1/2811* (2013.01); *H04R 1/2819* (2013.01); *H04R 1/288* (2013.01); *H04R 1/345* (2013.01); *H10K 59/122* (2023.02); *H10K 59/131* (2023.02); *H10K 77/111* (2023.02); *H04R 1/2834* (2013.01);

(Continued)

(58) Field of Classification Search
CPC . H01L 27/3246; H01L 27/3283; H01L 51/56; H10K 59/122
See application file for complete search history.

(56) References Cited

U.S. PATENT DOCUMENTS

| | | | |
|---|---|---|---|
| 7,250,634 | B2 | 7/2007 | Yokoyama et al. |
| 7,439,539 | B2 | 10/2008 | Jeoung et al. |

(Continued)

FOREIGN PATENT DOCUMENTS

| | | |
|---|---|---|
| JP | 2007-048571 | 2/2007 |
| JP | 2007-133371 | 5/2007 |

(Continued)

*Primary Examiner* — Anh D Mai
(74) *Attorney, Agent, or Firm* — F. CHAU & ASSOCIATES, LLC

(57) ABSTRACT

An organic light emitting device includes: a substrate; a first electrode provided on the substrate; a metal pattern provided along an edge of the first electrode; and a pixel definer provided on the metal pattern. The pixel definer covers an end portion of the first electrode and an end portion of the metal pattern. The pixel definer includes an opening exposing the first electrode.

5 Claims, 19 Drawing Sheets

(51) Int. Cl.
H10K 77/10 (2023.01)
H10K 102/00 (2023.01)

(52) U.S. Cl.
CPC ..... *H10K 59/1201* (2023.02); *H10K 2102/00* (2023.02); *H10K 2102/311* (2023.02)

(56) References Cited

U.S. PATENT DOCUMENTS

| | | | |
|---|---|---|---|
| 7,723,179 | B2 | 5/2010 | Yamazaki et al. |
| 7,732,267 | B2 | 6/2010 | Jeoung et al. |
| 7,830,476 | B2 | 11/2010 | Park |
| 7,948,171 | B2 | 5/2011 | Sakakura et al. |
| 8,222,809 | B2 | 7/2012 | Lee et al. |
| 8,462,097 | B2 | 6/2013 | Kim et al. |
| 8,507,912 | B2 | 8/2013 | Kim |
| 8,568,463 | B2 | 10/2013 | Sakakura et al. |
| 8,642,360 | B2 * | 2/2014 | Komatsu ............... H05B 33/10 438/22 |
| 9,093,402 | B2 | 7/2015 | Sakakura et al. |
| 9,711,750 | B1 * | 7/2017 | Kim ................... H01L 27/3258 |
| 10,847,547 | B2 | 11/2020 | Kimura |
| 11,296,124 | B2 | 4/2022 | Kimura |
| 2006/0017375 | A1 | 1/2006 | Noguchi et al. |
| 2010/0200861 | A1 * | 8/2010 | Lee ..................... H10K 59/131 257/E21.414 |
| 2012/0007057 | A1 * | 1/2012 | Choi .................. H01L 27/3246 257/E51.019 |
| 2012/0146004 | A1 | 6/2012 | Lee et al. |
| 2013/0248920 | A1 | 9/2013 | Kuwabara et al. |
| 2014/0034923 | A1 | 2/2014 | Kim et al. |
| 2015/0041772 | A1 * | 2/2015 | Han .................. H10K 50/8426 438/23 |
| 2015/0129883 | A1 | 5/2015 | Kimura |
| 2016/0190225 | A1 * | 6/2016 | Kim .................. H01L 27/3248 438/23 |
| 2017/0053973 | A1 * | 2/2017 | Park .................. H01L 51/5246 |
| 2017/0294501 | A1 | 10/2017 | Jang et al. |
| 2022/0310663 | A1 | 9/2022 | Kimura |

FOREIGN PATENT DOCUMENTS

| | | | | | |
|---|---|---|---|---|---|
| KR | 10-2006-0011397 | | 2/2006 | | |
| KR | 10-2007-004 | | 5/2007 | | |
| KR | 1020080078164 | A * | 8/2008 | .......... | G02F 1/1343 |
| KR | 10-2011-0103904 | | 9/2011 | | |
| KR | 10-2012-0019024 | | 3/2012 | | |
| KR | 10-2012-0032906 | | 4/2012 | | |
| KR | 10-2013-0036271 | | 4/2013 | | |
| KR | 10-2016-0041164 | | 4/2016 | | |

* cited by examiner

FIG. 1

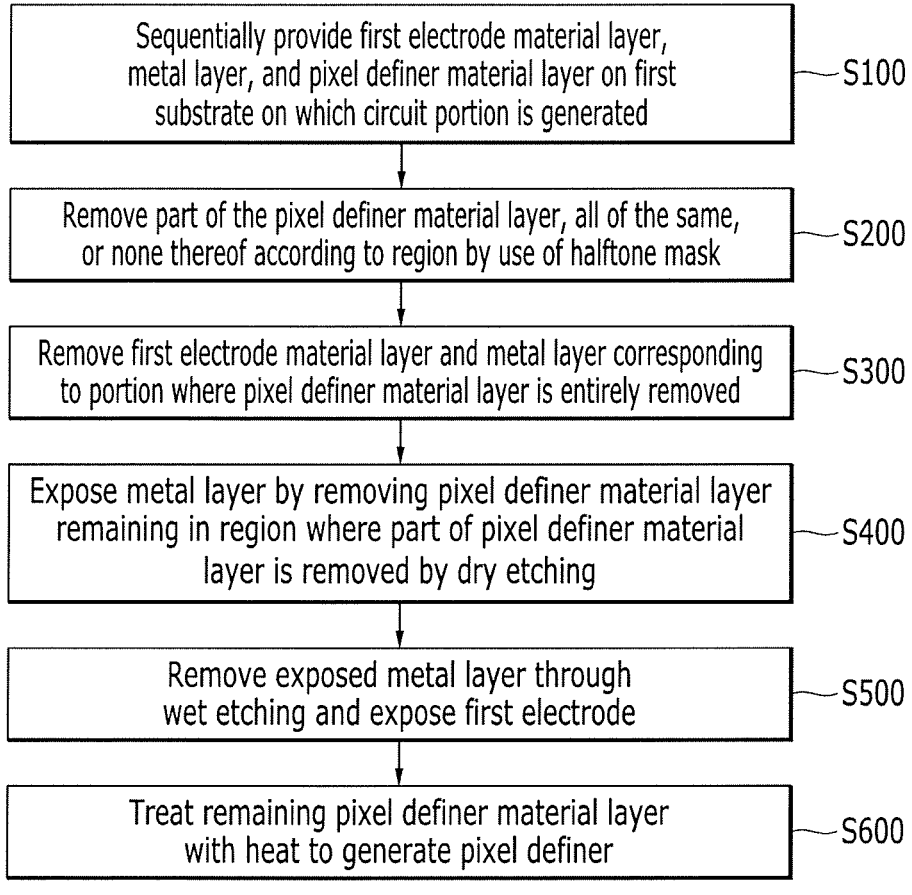

Sequentially provide first electrode material layer, metal layer, and pixel definer material layer on first substrate on which circuit portion is generated — S100

Remove part of the pixel definer material layer, all of the same, or none thereof according to region by use of halftone mask — S200

Remove first electrode material layer and metal layer corresponding to portion where pixel definer material layer is entirely removed — S300

Expose metal layer by removing pixel definer material layer remaining in region where part of pixel definer material layer is removed by dry etching — S400

Remove exposed metal layer through wet etching and expose first electrode — S500

Treat remaining pixel definer material layer with heat to generate pixel definer — S600

METHOD OF MANUFACTURING AN ORGANIC LIGHT-EMITTING DISPLAY DEVICE INCLUDING FORMING THE PIXEL DEFINER BY MELTING THE PIXEL DEFINER MATERIAL LAYER PATTERNED ON THE PIXEL ELECTRODE PATTERN

CROSS-REFERENCE TO RELATED APPLICATIONS

This application is a Division of co-pending U.S. patent application Ser. No. 15/356,755, filed on Nov. 21, 2016, which claims priority to and the benefit of Korean Patent Application No. 10-2016-0044914 filed in the Korean Intellectual Property Office on Apr. 12, 2016, the entire contents of which are incorporated by reference herein.

TECHNICAL FIELD

The present invention relates generally to an organic light-emitting display device and a method of manufacturing the same.

DISCUSSION OF RELATED ART

Organic light-emitting diode (OLED) display devices are self-illuminating and therefore do not require a separate light source to display an image. Accordingly, OLED display devices tend to be thin and light. OLED display devices also have other characteristics such as low power consumption, high luminance, and a high reaction speed.

Various methods for manufacturing organic light emitting display devices have been developed. However, electrodes of the OLED display devices may be damaged during these manufacturing processes. Damaging the electrodes may result in the deterioration of the lifespan of the light-emitting diode or cause defects in image quality.

SUMMARY

Exemplary embodiments of the present invention provide an organic light-emitting display device. The organic light-emitting display device includes a substrate; a first electrode provided on a substrate; a metal pattern provided along an edge of the first electrode; and a pixel definer provided on the metal pattern. The pixel definer covers an end portion of the first electrode and an end portion of the metal pattern. The pixel definer includes an opening exposing the first electrode.

The metal pattern may have a thickness substantially equal to or greater than about 100 Å and substantially equal to or less than about 10,000 Å.

The metal pattern may have an etching selection ratio that is different from an etching selection ratio of the first electrode.

The metal pattern may include at least one of copper (Cu) or a copper (Cu) alloy.

The copper (Cu) alloy may include at least one of titanium copper (TiCu) or molybdenum copper (MoCu).

The metal pattern may include a stacked configuration of a plurality of layers.

The stacked configuration may be a configuration of a titanium (Ti) layer/aluminum (Al) layer or a titanium (Ti) layer/aluminum (Al) layer/titanium (Ti) layer.

An upper surface of the pixel definer may have a curved shape.

The organic light-emitting display device may include a display area including a plurality of pixels. The organic light-emitting display device may further include a peripheral area surrounding the display area. The first electrode, the metal pattern, and the pixel definer may be provided in the display area. The organic light-emitting display device may further include a dam portion. The dam portion may be provided in the peripheral area and may be provided along an edge of the substrate.

The dam portion may include a first layer, a second layer, and a third layer. The first layer may include a same material as the first electrode. The second layer may include a same material as the metal pattern. The third layer may include a same material as the pixel definer.

The organic light-emitting display device may be a flexible display device.

Exemplary embodiments of the present invention provide a method of manufacturing an organic light-emitting display device. The method includes disposing a first electrode material layer, a metal layer, and a pixel definer material layer on a substrate. A first electrode is disposed by patterning the first electrode material layer. The pixel definer material layer remaining on the first electrode is removed to expose the metal layer. The metal layer exposed by the pixel definer material layer is removed to dispose a metal pattern provided along an edge of the first electrode. A pixel definer is generated by heat treating the pixel definer material layer remaining on the first electrode and the metal pattern.

The removing of the pixel definer material layer may include dry etching the pixel definer material layer. The removing of the metal layer may include wet etching the metal layer.

The generating of the first electrode may include using a halftone mask. The halftone mask may include a first region, a second region, and a third region. The disposing of the first electrode may further include retaining the pixel definer material layer corresponding to the first region, removing a part of the pixel definer material layer corresponding to the second region in a thickness direction, and removing substantially the entire pixel definer material layer corresponding to the third region; and removing the metal layer and the first electrode material layer corresponding to the third region.

The metal layer may have an etching selection ratio that is different from an etching selection ratio of the first electrode material layer.

The removing of the metal layer and the first electrode material layer corresponding to the third region may include removing the first electrode material layer prior to removing the metal layer.

A part of the pixel definer material layer may be melted by the heat treatment to generate a pixel definer. The pixel definer may cover an end portion of the metal pattern and an end portion of the first electrode.

The heat treatment may be performed at a temperature that is substantially equal to or greater than about 200° C. and less than about 400° C.

The disposing of the first electrode may further include disposing a dam portion along an edge of the substrate.

The halftone mask may include a fourth region having substantially the same transmittance as the first region. The dam portion may correspond to the fourth region. Exemplary embodiments of the present invention provide a method of manufacturing an organic light-emitting display device. The method includes disposing a first electrode material layer, a metal layer, and a pixel definer material layer on a substrate. A first electrode is disposed by patterning the first electrode material layer using a halftone mast. The pixel definer material layer is pattered using the halftone mask. The pixel definer material layer may be retained, partially removed, or removed. The first electrode material layer and the metal layer are removed corresponding to an area in which the pixel defining layer is removed. The pixel definer material layer is removed corresponding to an area in which the pixel defining layer is partially removed. The metal layer is disposed on and covering the first electrode. A pixel definer is disposed by heat treating the pixel definer material layer remaining on the first electrode.

The method may further include removing the metal layer exposed by the pixel definer material layer to generate a metal pattern.

The removing of the pixel definer material layer may include dry etching the pixel definer material layer. The removing of the metal layer may include wet etching.

The metal layer may include an etching selection ratio that is different from an etching selection ratio of the first electrode material layer.

The disposing of the first electrode may further include disposing a dam portion along an edge of the substrate.

BRIEF DESCRIPTION OF THE DRAWINGS

These and/or other aspects will become more apparent and more readily appreciated from the following description of the exemplary embodiments of the present invention, taken in conjunction with the accompanying drawings, in which:

FIG. 1 is a flowchart illustrating a method of manufacturing an organic light-emitting device according to an exemplary embodiment of the present invention;

FIGS. 9 to 11 illustrate an organic light-emitting device according to an exemplary embodiment of the present invention;

FIGS. 13 and 14 illustrate an organic light-emitting device according to an exemplary embodiment of the present invention.

DETAILED DESCRIPTION OF THE EMBODIMENTS

Figure 2:
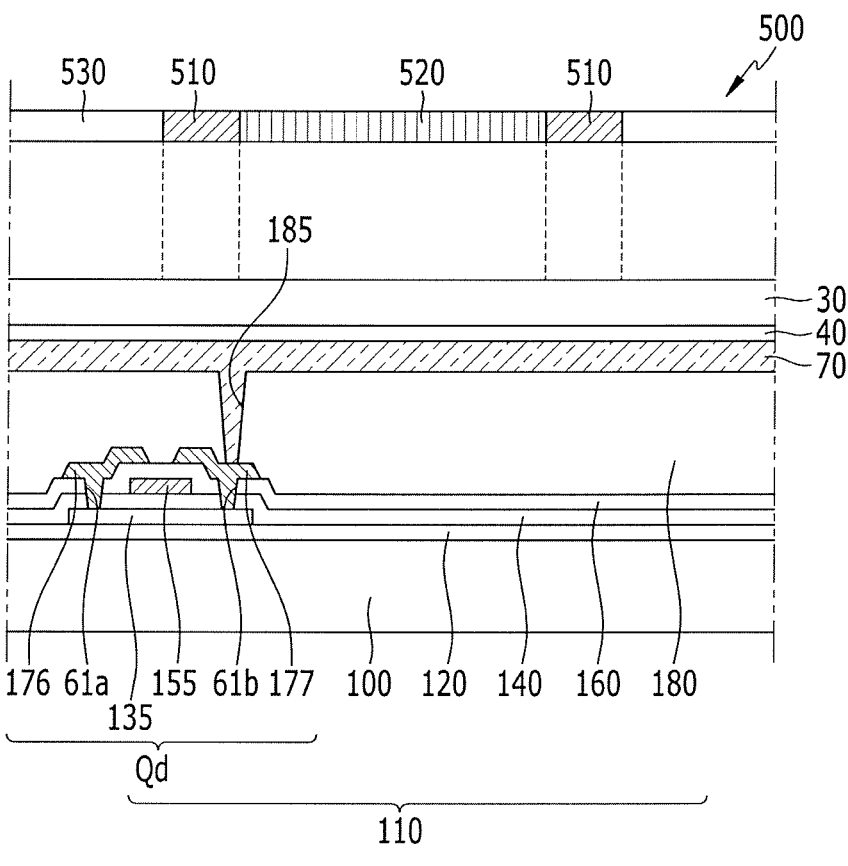
FIGS. 2 to 8 illustrate a method of manufacturing an organic light-emitting device according to an exemplary embodiment of the present invention.

Exemplary embodiments of the present invention may have different forms and embodiments and should not be construed as being limited to the descriptions set forth herein. Accordingly, the drawings and description are illustrative and not restrictive. It is to be understood that like reference numerals designate like elements throughout the specification and figures.

The size and thickness of each component illustrated in the drawings may be exaggerated for convenience of explanation, but the following exemplary embodiments of present invention are not limited thereto.

It will be understood that when an element such as a layer, film, region, or substrate is referred to as being "on" another element, it can be directly on the other element or intervening elements may also be present.

When a certain exemplary embodiment of the present invention may be implemented differently, a specific process order may be performed differently from the described order. For example, two consecutively described processes may be performed substantially at the same time or performed in the order opposite to the described order. FIG. 1 is a flowchart illustrating a method of manufacturing an organic light-emitting device according to an exemplary embodiment of the present invention. FIGS. 2 to 8 illustrate a method of manufacturing an organic light-emitting device according to an exemplary embodiment of the present invention.

Referring to FIGS. 1 and 2, a first electrode material layer 70, a metal layer 40, and a pixel definer material layer 30 may be provided on a first substrate 100, S100. A circuit portion 110 may be generated on the substrate 100, S100.

The circuit portion 110 may include a plurality of thin film transistors. The plurality of thin film transistors may include a driving transistor Qd. The circuit portion 110 may further include insulating layers. The insulating layers may include a buffer layer 120 and a planarization layer 180; however, embodiments of the present invention are not limited thereto. The first electrode material layer 70 provided on the circuit portion 110 may be provided on substantially the entire region of the first substrate 100. The first electrode material layer 70 may be connected to the driving transistor Qd. The first electrode material layer 70 may also be light reflective, light semi-transmittable, or light transmittable. For example, the first electrode material layer 70 may include a metal oxide such as an indium tin oxide (ITO), indium zinc oxide (IZO), zinc oxide (ZnO), or indium(III) oxide ($In_2O_3$). Alternatively, the first electrode material layer 70 may include a metal such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), LiF/Ca, or LiF/Al, or an alloy thereof; however, embodiments of the present invention are not limited thereto. Further, the first electrode material layer 70 may be formed to be a single layer or may have a multi-layered structure. In the multi-layered structure, a plurality of layers may be stacked.

The metal layer 40 may be provided on the first electrode material layer 70. The metal layer 40 may be provided on substantially the entire first electrode material layer 70. The metal layer 40 may include a material with an etching selection ratio that is different from an etching selection ratio of the first electrode material layer 70. For example, the metal layer 40 may include copper (Cu) and a copper (Cu) alloy. The metal layer 40 may also include titanium copper (TiCu) or molybdenum copper (MoCu) as the copper (Cu) alloy. The metal layer 40 may have a thickness substantially equal to or greater than about 100 Å. The metal layer 40 may have a thickness substantially equal to or less than about 10,000 Å. When the metal layer 40 is less than about 100 Å, the metal layer 40 might not have a substantially uniform thickness. Furthermore, the metal layer 40 may not sufficiently protect the first electrode material layer 70 during a dry etching process. When the metal layer 40 is greater than about 10,000 Å, it may be difficult to etch and remove the metal layer 40.

The pixel definer material layer 30 may be provided on the metal layer 40. The pixel definer material layer 30 may be provided on substantially the entire metal layer 40. The pixel definer material layer 30 may include a photosensitive organic film. The photosensitive organic film may include one of an olefin-based organic material, an acryl-based organic material, and an imide-based organic material.

Figure 3:
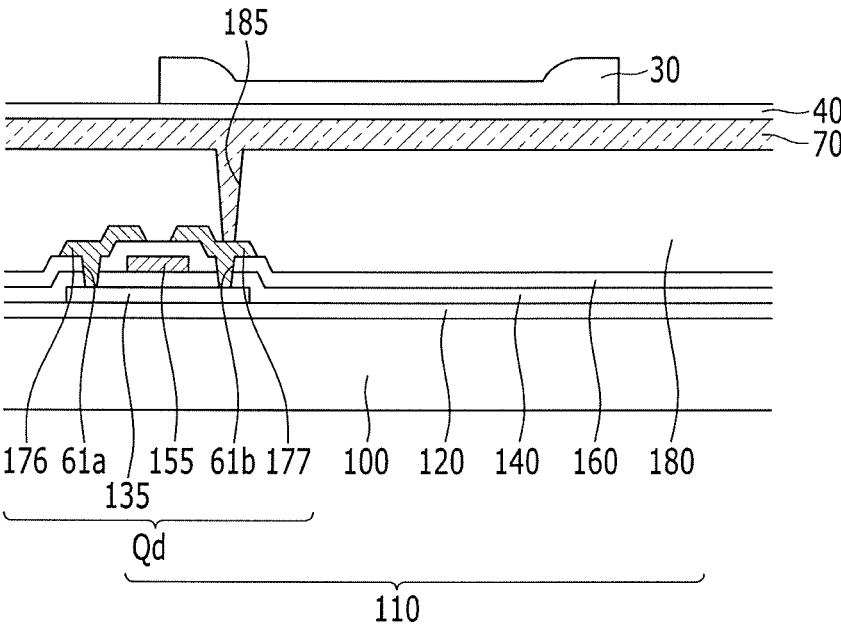

Referring to FIGS. 1 to 3, a halftone mask 500 may be used to remove a part of the pixel definer material layer 30, substantially all of the pixel definer material layer 30, or substantially none of the pixel definer material layer 30 according to a region S200 by using a halftone mask 500.

Figure 4:
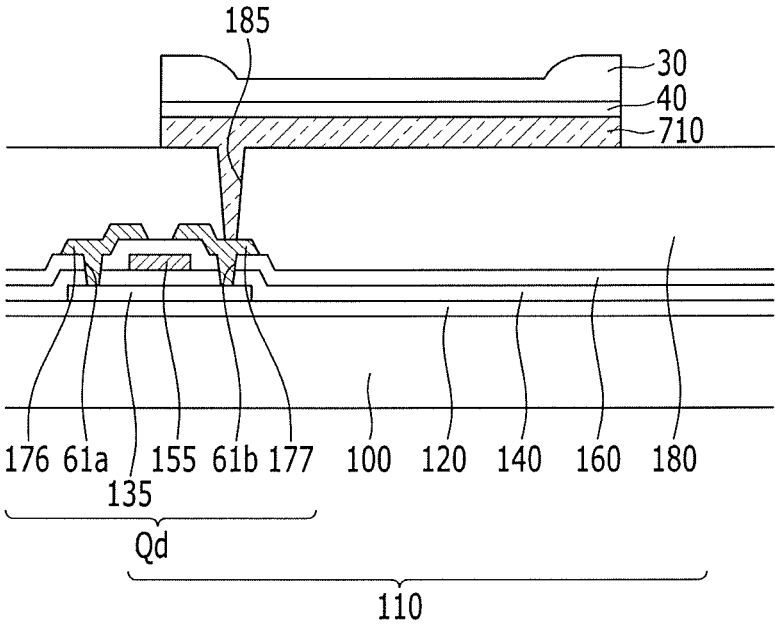
Figure 7A:
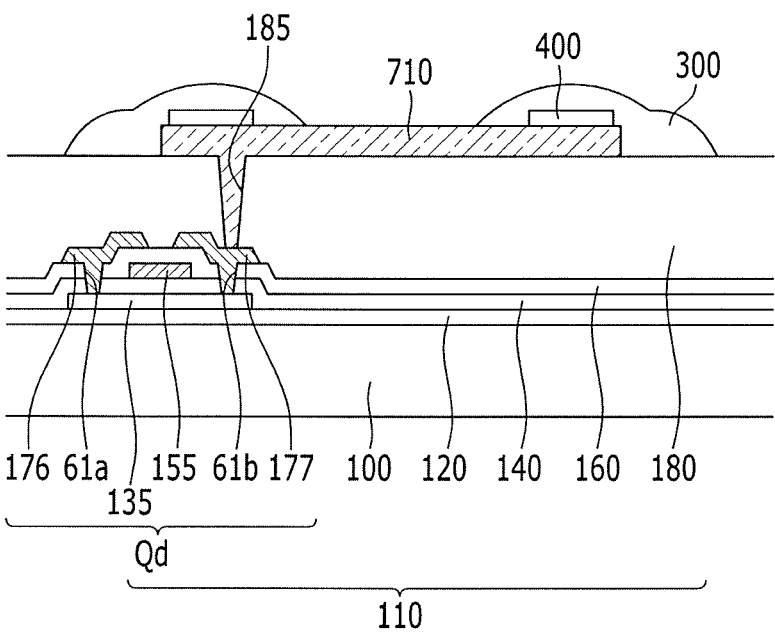

Referring to FIG. 2, FIG. 4, and FIG. 7A, the halftone mask 500 may be used to expose the pixel definer material layer 30. A region in which a pixel definer 300 may be generated by the halftone mask 500, a region which may become a first electrode 710 when the first electrode material layer 70 remains, and a region in which the first electrode material layer 70 and the metal layer 40 may be removed are exposed to different degrees.

The halftone mask 500 may include a light blocker 510. The light blocker 510 may block substantially all light. The halftone mask 500 may also include a first light transmitter 520. The first light transmitter 520 may transmit a portion of light. For example, the first light transmitter 520 may transmit about 50% of light. The halftone mask 500 may further include a second light transmitter 530. The second light transmitter 530 may transmit substantially all light. For example, the second light transmitter 530 may transmit about 100% of light. The halftone mask 500 may be disposed so that the light blocker 510 may correspond to a region where the pixel definer 300 may be generated, the first light transmitter 520 may correspond to a region where the first electrode material layer 70 may remain to become the first electrode 710, and the second light transmitter 530 may correspond to a region where the first electrode material layer 70 and the metal layer 40 may be removed.

Referring to FIG. 3, the pixel definer material layer 30 may be substantially entirely removed from the portion that is exposed by the second light transmitter 530. Therefore, the metal layer 40 may be exposed. Additionally, the pixel definer material layer 30 may remain in the portion of which substantially all light is blocked by the light blocker 510. A part of the pixel definer material layer 30 may be removed in the thickness direction from the portion through which a portion of light is transmitted by the first light transmitter 520. For example, 50% of the light may be transmitted though the party of the pixel definer material layer 30.

Referring to FIG. 4, the first electrode material layer 70 and the metal layer 40 may be removed to correspond to the portion where the pixel definer material layer 30 is entirely removed S300.

The metal layer 40 and the first electrode material layer 70 may be removed using the pixel definer material layer 30 as a mask. The metal layer 40 may be wet etched using a first etchant. The first etchant may include any etchant that selectively etches the metal layer 40 and does not etch the first electrode material layer 70. The first electrode material layer 70 may be wet etched and removed by using a second etchant. The second etchant may etch the first electrode material layer 70. As illustrated in FIG. 4, the form of the first electrode 710 may be substantially completed.

Figure 5:
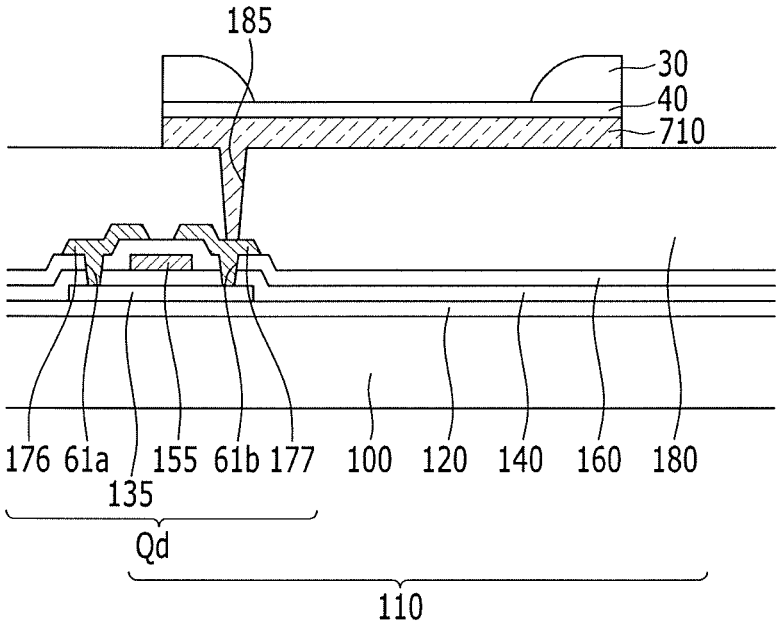

Referring to FIGS. 2, 4 and 5, the pixel definer material layer 30 remaining in the region in which part of the pixel definer material layer 30 is removed may be removed by dry etching to expose the metal layer 40, S400.

The portion corresponding to the first light transmitter 520 of the halftone mask 500 may be dry etched. Therefore, the remaining pixel definer material layer 30 may be removed and may expose the metal layer 40. The first electrode 710 may be covered by the metal layer 40. Therefore, the first electrode 710 might not be exposed during the dry etching process. Therefore, the first electrode may be prevented from being damaged by the dry etching process. When the first electrode 710 is exposed and the first electrode 710 is damaged during the dry etching process, a non-uniformly curved portion may be generated on a surface of the first electrode 710. Accordingly, when the organic light-emitting device is driven, charges may be provided on the curved portion. Therefore, image quality of the organic light-emitting device may be deteriorated and the lifespan of the organic light-emitting device may be reduced. According to an exemplary embodiment of the present invention, the first electrode 710 may be covered by the metal layer 40 while the dry etching process is performed. Therefore, the first electrode 710 may be prevented from being damaged by the dry etching process.

Figure 6:
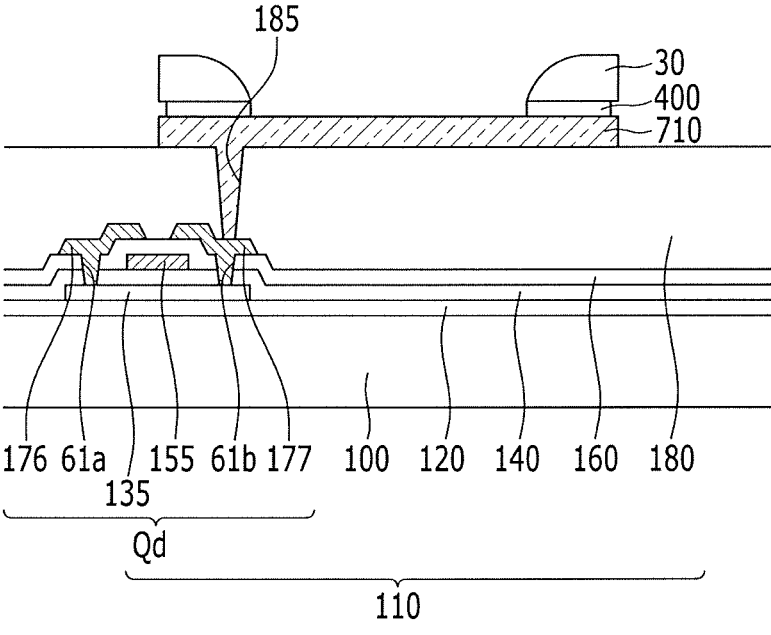

Referring to FIG. 6, the metal layer 40 of the portion exposed by the pixel definer material layer 30 may be removed through wet etching S500. Therefore, the first electrode 710 may become exposed S500.

The metal layer 40 exposed by the dry etching process may be removed using a first etchant. The first etchant may selectively etch the metal layer 40 with a particular etching selection ratio. The first electrode 710 may be exposed on the portion in which the metal layer 40 is removed. The first etchant may have an etching selection ratio with respect to the metal layer 40 so the first electrode 710 may be exposed without being damaged.

The metal layer 40 of the portion exposed by the pixel definer material layer 30 may be removed by wet etching. The metal layer 40 may remain on the portion covered by the pixel definer material layer 30 to generate a metal pattern 400. The metal pattern 400 may be provided on an edge of the first electrode 710. A side end portion of the metal layer 40 etched by the first etchant and exposed in the step S300 may be exposed to the first etchant in the wet etching process. Therefore, the side end portion of the metal layer 40 may be further etched as compared to the side end portion of the first electrode 710. As illustrated in FIG. 6, the side end portion of the metal pattern 400 provided near the side end portion of the first electrode 710 may generate a step-like shape together with the side end portion of the first electrode 710. Accordingly, the side end portion of the metal pattern 400 provided near the side end portion of the first electrode 710 may have a cross-sectional shape that is caved in between the side end portion of the first electrode 710 and the side end portion of the pixel definer material layer 30. When the metal layer 40 of the portion exposed by the pixel definer material layer 30 is removed by the first etchant, the side end portions of the metal layer 40 and the first electrode 710 may be exposed by the first etchant. The first etchant may be an etchant that does not etch the first electrode 710; therefore, the side end portion of the metal layer 40 may be further etched. As illustrated in FIG. 5, the side end portion of the first electrode 710 and the side end portion of the metal layer 40 may be provided on substantially a same line in a cross-sectional view. When the etching process of the step S500 is performed, the side end portion of the metal pattern 400 may be provided on the inner side. Compared to the side end portion of the first electrode 710 in a cross-sectional view, the side end portion of the metal pattern 400 may have a caved in shape as illustrated in FIG. 6.

Figure 7B:
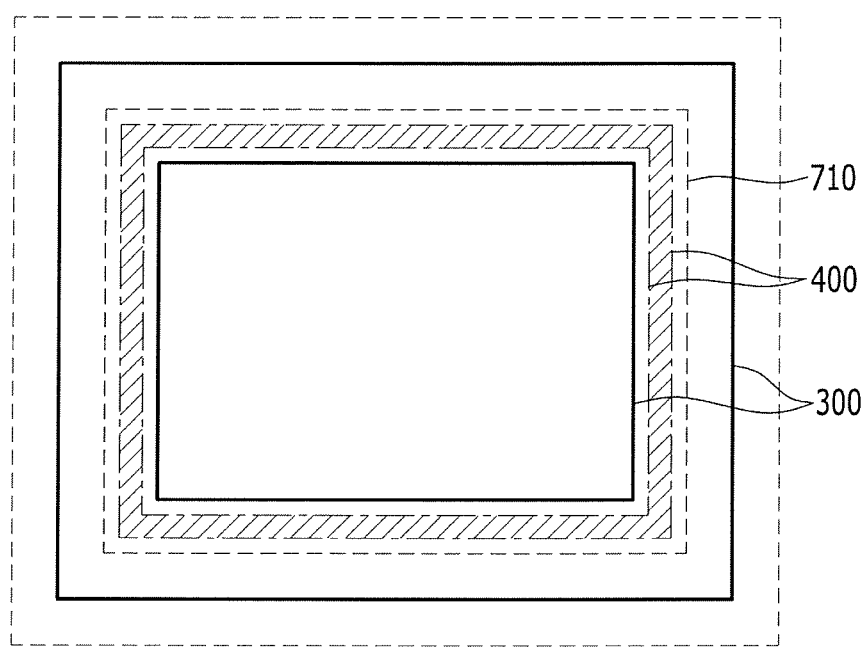

Referring to FIGS. 7A and 7B, the remaining pixel definer material layer 30 may be treated with heat to generate the pixel definer 300, S600. FIG. 7A illustrates a cross-sectional view of a pixel definer 300 according to an exemplary embodiment of the present invention. FIG. 7B illustrates a top plan view of a pixel definer of FIG. 7A according to an exemplary embodiment of the present invention.

The pixel definer material layer 30 may be provided on an upper portion of the metal pattern 400 provided on the edge of the first electrode 710. The pixel definer material layer 30 may expose end portions of the metal pattern 400 and the first electrode 710. When the pixel definer material layer 30 is heated, a part of the pixel definer material layer 30 may melt and flow downward to a peripheral area. The heat treatment temperature may be substantially equal to or greater than about 200° C. and less than about 400° C. When the heat treatment temperature is less than about 200° C., the pixel definer material layer 30 might not melt to flow downward. When the heat treatment temperature is substantially equal to or greater than about 400° C., the pixel definer material layer 30 may be burned.

Figure 8:
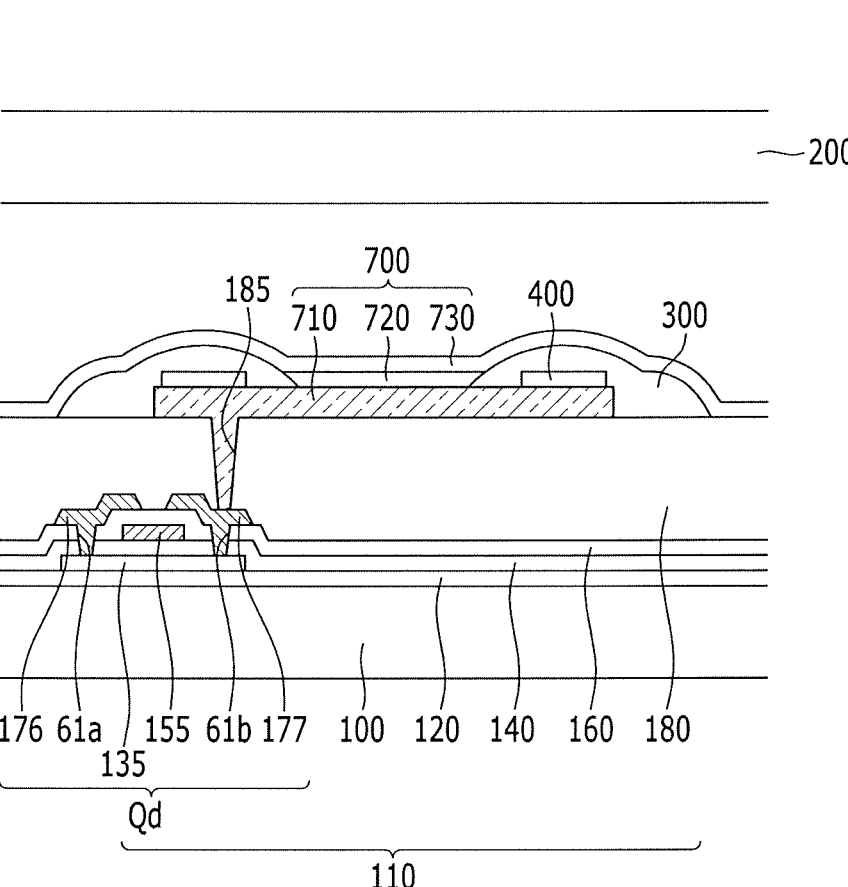

The pixel definer 300 substantially entirely covering the end portions of the metal pattern 400 and the first electrode 710 may be provided. When part of the end portions of the metal pattern 400 and the first electrode 710 are exposed, the exposed portion may contact a second electrode 730 and a short circuit may be generated. According to an exemplary embodiment of the present invention, the pixel definer 300 may substantially entirely cover the end portions of the metal pattern 400 and the first electrode 710. Accordingly, the generation of a short circuit may be prevented. As illustrated in FIG. 7A, the edge of the pixel definer 300 generated by the heat treatment may have a soft curve. Referring to FIG. 8, when the second electrode 730 provided on the edge of the pixel definer 300 is thin, the second electrode 730 might not be cut by an angulated portion of the pixel definer 300.

As illustrated in FIG. 8, an organic layer 720, the second electrode 730, and a second substrate 200 may be provided on the first electrode 710. The first electrode 710 may be exposed by the pixel definer 300.

According to a method for manufacturing an organic light-emitting device 1000, according an exemplary embodiment of the present invention, when the pixel definer material layer 30 is removed by the dry etching process, the first electrode 710 may be protected by the metal layer 40. Therefore, a manufacturing process may be simplified by generating the first electrode 710 and the pixel definer 300 according to a single mask process. Furthermore, generation of image defects and deterioration of lifespan of the organic light-emitting device may be prevented by preventing damage to the first electrode 710.

Figure 9:
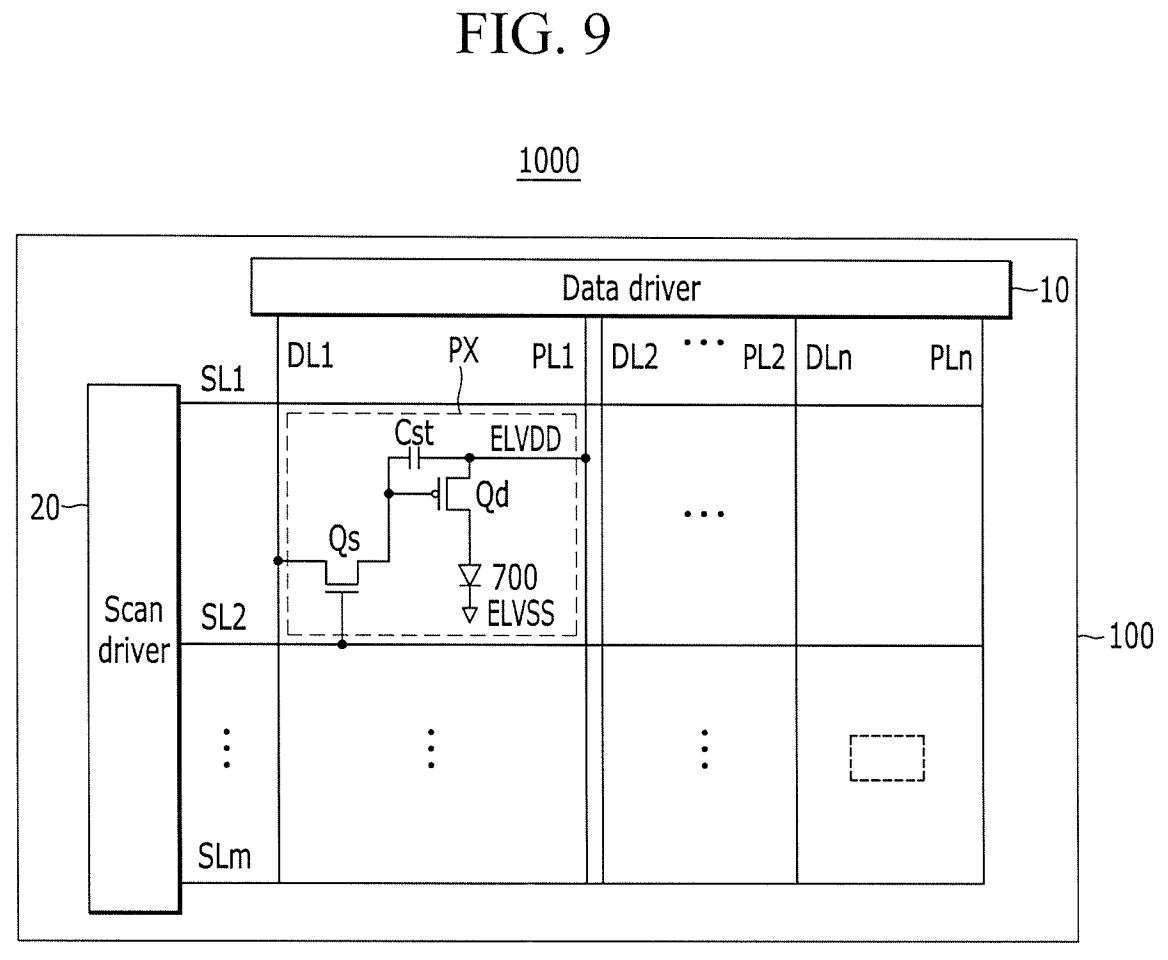
Figure 10:
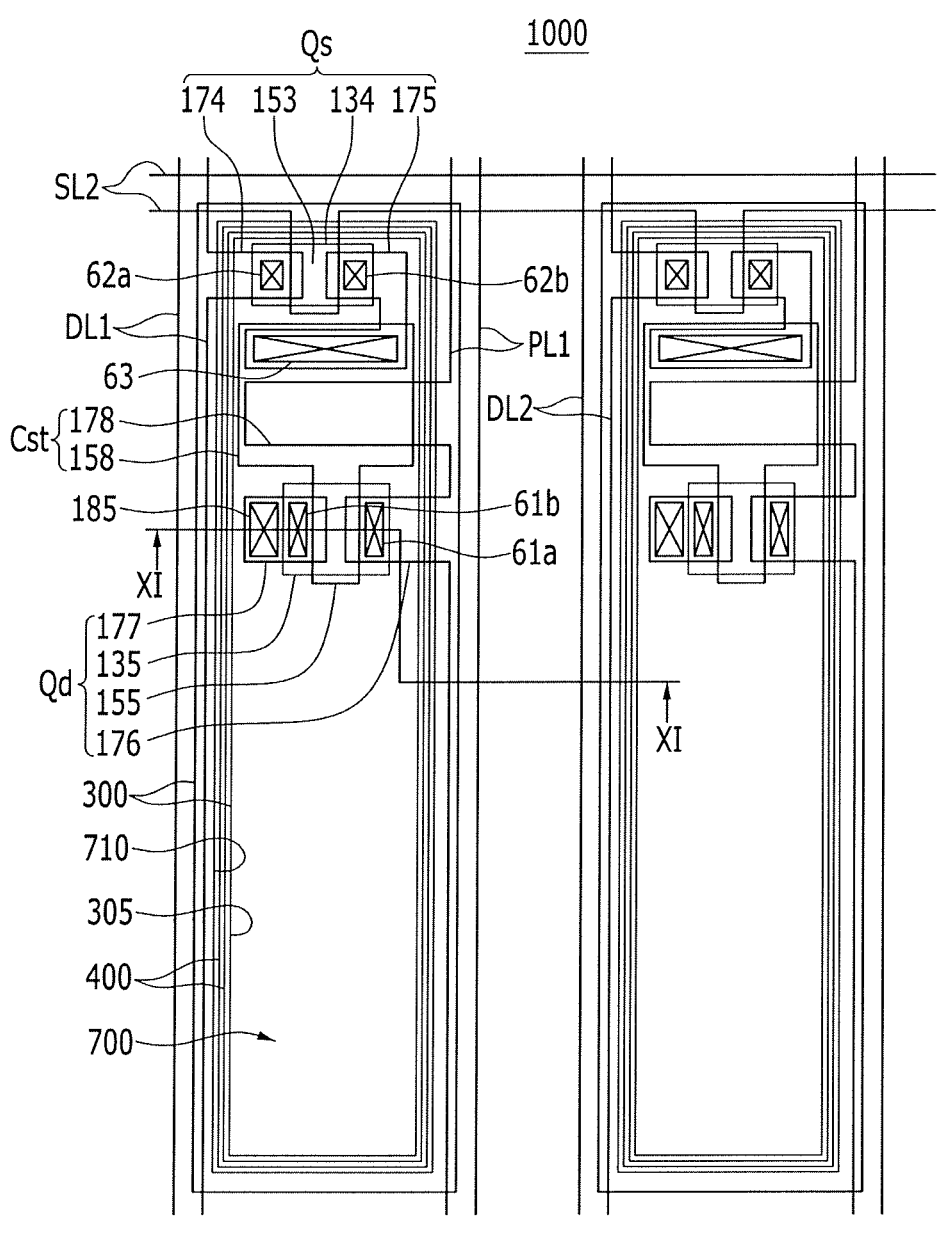
Figure 11:
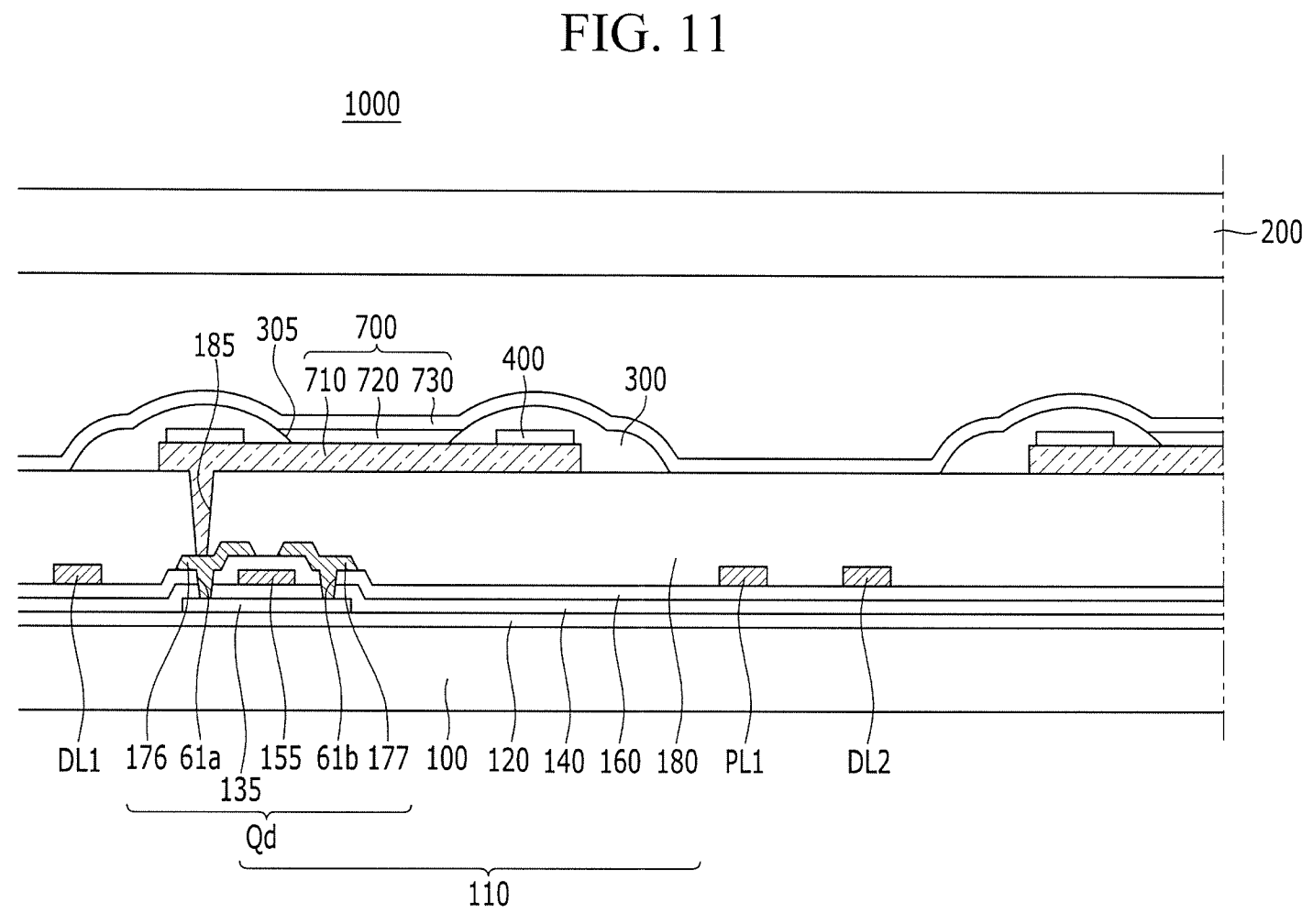

FIGS. 9 to 11 illustrate an organic light-emitting device according to an exemplary embodiment of the present invention. Referring to FIGS. 9 to 11, an organic light-emitting device 1000 according to an exemplary embodiment of the present invention may be generated using the above-described method for manufacturing an organic light-emitting device; however, exemplary embodiments of the present invention are not limited thereto.

Furthermore, exemplary embodiments of the present invention provide an organic light-emitting device; however, exemplary embodiments of the present invention are not restricted to a number of thin film transistors (TFTs) and capacitors illustrated in the accompanying drawings and may include a plurality of transistors and at least one capacitor for each pixel. Additionally, organic light-emitting devices according to exemplary embodiments of the present invention may have various different configurations including an additional wire or omitting an existing wire. The pixel herein may represent a minimum unit for displaying an image and the organic light-emitting device may display images through a plurality of pixels.

FIG. 9 illustrates a schematic diagram of an organic light-emitting device according to an exemplary embodiment of the present invention. FIG. 10 illustrates a layout view of two pixels of an organic light-emitting device according to an exemplary embodiment of the present invention. FIG. 11 illustrates a cross-sectional view with respect to a line XI-XI of FIG. 10 according to an exemplary embodiment of the present invention. As illustrated in FIG. 9, the organic light-emitting device according to an exemplary embodiment of the present invention may include a plurality of pixels PX, a first substrate 100, a scan driver 20, and a data driver 10.

A plurality of scan lines SL1, . . . , SLm, a plurality of data lines DL1, . . . , DLn, and a plurality of driving voltage lines PL1, . . . , PLn are connected to a plurality of pixels PX. The plurality of scan lines SL1, . . . , SLm may extend substantially in a row direction. The plurality of scan lines SL1, . . . , SLm may be substantially parallel to each other. The plurality of data lines DL1, . . . , DLn and the plurality of driving voltage lines PL1, . . . , PLn may extend substantially in a column direction. The plurality of scan lines SL1, . . . , SLm and the plurality of driving voltage lines PL1, . . . , PLn may be substantially parallel to each other.

The respective pixels PXs may include a switching transistor Qs. The switching transistor Qs may be connected to the scan lines SL1, . . . , SLm and the data lines DL1, . . . , DLn. The respective pixels PXs may further include a storage capacitor Cst and a driving transistor Qd. The driving transistor Qd may be connected between a plurality of switching transistors Qs and a plurality of driving voltage lines PL1 to PLn. The respective pixels PXs may further include an organic light-emitting diode 700. The organic light-emitting diode may be connected to the driving transistor Qd.

The scan driver 20 may apply a scan signal to the scan lines SL1, . . . , SLm. The data driver 10 may apply a data signal to the data lines DL1, . . . , DLn.

The switching transistor Qs may include a control terminal, an input terminal, and an output terminal. The control terminal may be connected to the scan lines SL1, . . . , SLm. The input terminal may be connected to the data lines DL1, . . . , DLn. The output terminal may be connected to the driving transistor Qd. The switching transistor Qs may transmit the data signal applied to the data lines DL1, . . . , DLn to the driving transistor Qd in response to the scan signal applied to the scan lines SL1, . . . , SLm.

The driving transistor Qd may include a control terminal, an input terminal, and an output terminal. The control terminal may be connected to the switching transistor Qs. The input terminal may be connected to the driving voltage lines PL1, . . . , PLn for transmitting a driving voltage (ELVDD). The output terminal may be connected to the organic light-emitting diode 700.

The organic light-emitting diode 700 may include an anode. The anode may be connected to an output terminal of the driving transistor Qd. A cathode may be connected to a common voltage line for transmitting a common voltage ELVSS.

When the switching transistor Qs is turned on according to a scan signal, a data signal may be charged in the storage capacitor Cst and the control terminal of the driving transistor Qd. Accordingly, the driving transistor Qd may be turned on to apply a driving voltage ELVDD of the driving voltage lines PL1, . . . , PLn to the organic light-emitting diode 700. As such, the organic light-emitting diode 700 may emit light.

As illustrated in FIG. 10 and FIG. 11, the organic light-emitting device 1000 according to an exemplary embodiment of the present invention may include a first substrate 100, a plurality of thin film transistors, a circuit portion 110, an organic light-emitting diode 700, an organic layer 720, a second electrode 730, a metal pattern 400, a pixel definer 300, and a second substrate 200. The plurality of thin film transistors may include a driving transistor Qd. The circuit portion 110 may include insulating layers such as a buffer layer 120 and a passivation layer 180. The organic light-emitting diode 700 may include a first electrode 710.

The first substrate 100 may be an insulating substrate including glass, quartz, ceramic, or plastic; however, embodiments of the present invention are not limited thereto. The first substrate 100 may further include a flexible substrate, a stretchable substrate, or a rollable substrate. The flexible substrate, the stretchable substrate, and the rollable substrate may include an organic material such as polyimide (PI), polycarbonate (PC), polyethylene (PE), polyethylene terephthalate (PET), or polyacrylate.

A buffer layer 120 may be generated on the first substrate 100. The buffer layer 120 may include a silicon nitride (SiNx) or a silicon oxide (SiOx). The buffer layer 120 may include a single layer or multiple layers. The buffer layer 120 may prevent permeation impurities such as oxygen or moisture. The buffer layer 120 may also substantially simultaneously flattens the surface.

A switching semiconductor layer 134 and a driving semiconductor layer 135 may be disposed to be separated from each other on the buffer layer 120. The switching semiconductor layer 134 may include a polycrystalline silicon (poly-Si). The switching semiconductor layer 134 may include a switching channel region, a switching source region, and a switching drain region. The driving semiconductor layer 135 may include a polycrystalline silicon (poly-Si). The driving semiconductor layer 135 may include a driving channel region, a driving source region, and a driving drain region. The switching source region and the switching drain region may be disposed on respective sides of the switching channel region. The driving source region and the driving drain region may be disposed on respective sides of the driving channel region.

The switching and driving channel regions may include polycrystalline silicon (poly-Si) to which an impurity is not doped. Therefore, the switching and driving channel regions may function as an intrinsic semiconductor. The switching and driving source regions and the switching and driving drain regions may include polycrystalline silicon (poly-Si) to which a conductive impurity is doped. Therefore, the switching and driving source regions and the switching and driving drain regions may function as an impurity semiconductor.

A gate insulating layer 140 may be disposed on the buffer layer 120, the switching semiconductor layer 134, and the driving semiconductor layer 135. The gate insulating layer 140 may include a single layer or multiple layers which may include a silicon nitride (SiNx) and/or a silicon oxide (SiOx).

A scan line SL2 and first storage capacitive plate 158 may be disposed on the gate insulating layer 140.

The scan line SL2 may extend in a horizontal direction and may transmit a scan signal. The scan line SL2 may include a switching gate electrode 153. The switching gate electrode 153 may protrude from the scan line SL2 and may overlap the switching semiconductor layer 134. The switching gate electrode 153 may overlap the switching channel region.

The first storage capacitive plate 158 may include a driving gate electrode 155. The driving gate electrode 155 may protrude from the first storage capacitive plate 158 and may overlap the driving semiconductor layer 135. The driving gate electrode 155 may overlap the driving channel region.

An interlayer insulating layer 160 may be disposed on the scan line SL2, the first storage capacitive plate 158, and the gate insulating layer 140. The interlayer insulating layer 160 may include a single layer or multiple layers which may include at least one of a silicon nitride (SiNx) and/or a silicon oxide (SiOx).

A switching source exposure hole 62*a* and a switching drain exposure hole 62*b* may expose the switching source region and the switching drain region. The switching source exposure hole 62*a* and the switching drain exposure hole 62*b* may be provided in the interlayer insulating layer 160 and the gate insulating layer 140. Further, a driving source exposure hole 61*a* and a driving drain exposure hole 61*b* may expose the driving source region and the driving drain region. The driving source exposure hole 61*a* and the driving drain exposure hole 61*b* may be generated in the interlayer insulating layer 160 and the gate insulating layer 140.

A data line DL1, a driving voltage line PL1, a switching drain electrode 175, and a driving drain electrode 177 may be disposed on the interlayer insulating layer 160.

The data line DL1 may transmit a data signal. The data line DL1 may extend in a direction crossing the scan line SL2. The data line DL1 may include a switching source electrode 174. The switching source electrode 174 may protrude toward the switching semiconductor layer 134 from the data line DL1.

The driving voltage line PL1 may transmit a driving voltage. The driving voltage line PL1 may be separated from the data line DL1. The driving voltage line PL1 may extend in a same direction as the data line DL1. The driving voltage line PL1 may include a driving source electrode 176. The driving source electrode 176 may protrude to the driving semiconductor layer 135 from the driving voltage line PL1. The driving voltage line PL1 may further include a second storage capacitive plate 178. The second storage capacitive plate 178 may protrude from the driving voltage line PL1. The capacitive plate 178 may overlap the first storage capacitive plates 158. The first storage capacitive plate 158 and the second storage capacitive plate 178 may configure a storage capacitor Cst with an interlayer insulating layer 160 as a dielectric material.

The switching drain electrode 175 may be positioned toward the switching source electrode 174. The driving drain electrode 177 may be positioned toward the driving source electrode 176.

The switching source electrode 174 and the switching drain electrode 175 may be connected to the switching source region and the switching drain region, respectively, through the switching source exposure hole 62*a* and the switching drain exposure hole 62*b*, respectively. Further, the switching drain electrode 175 may be electrically connected to the first storage capacitive plates 158 and the driving gate electrode 155 through a first contact hole 63 provided in the interlayer insulating layer 160.

The driving source electrode 176 and the driving drain electrode 177 may be connected to the driving source region and the driving drain region, respectively, through the driving source exposure hole 61*a* and the driving drain exposure hole 61*b*, respectively.

The switching semiconductor layer 134, the switching gate electrode 153, the switching source electrode 174, and the switching drain electrode 175 may be included in a switching thin film transistor Qs. The driving semiconductor layer 135, the driving gate electrode 155, the driving source electrode 176, and the driving drain electrode 177 may be included in a driving thin film transistor Qd.

A planarization layer 180 may be disposed on the interlayer insulating layer 160, the data line DL1, the driving voltage line PL1, the switching drain electrode 175, and the driving drain electrode 177. The planarization layer 180 may include an organic material. An upper surface of the planarization layer 180 may be substantially flat. A second contact hole 185 may be provided in the planarization layer 180. The second contact hole 185 may expose the driving drain electrode 177.

The first electrode 710 may be provided on the planarization layer 180. The first electrode 710 may be electrically connected to the driving drain electrode 177 of the driving thin film transistor Qd through the second contact hole 185 provided in the planarization layer 180. The first electrode 710 may be an anode that is a hole injection electrode. The first electrode 710 may have characteristics of light reflection, light semi-transmission, or light transmission. For example, the first electrode 710 may include a metal oxide such as an indium tin oxide (ITO), indium zinc oxide (IZO), zinc oxide (ZnO), or indium(III) oxide ($In_2O_3$). Alternatively, the first electrode 710 may include a metal such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), LiF/Ca, or LiF/Al, or an alloy thereof. The first electrode 710 may be a single layer or multiple layers. In a multi-layer structure, a plurality of layers may be stacked.

The metal pattern 400 may be provided along an edge of the first electrode 710. The metal pattern 400 may have a continuous ring shape extending along the edge of the first electrode 710 in a plan view. The metal pattern 400 may include a material with an etching selection ratio that is different from an etching selection ratio of the first electrode 710. For example, the metal pattern 400 may include copper (Cu) or a copper (Cu) alloy. The metal pattern 400 may also include titanium copper (TiCu) or molybdenum copper (MoCu) as the copper (Cu) alloy. The metal pattern 400 may have a thickness substantially equal to or greater than about 100 Å. The metal pattern 400 may have a thickness substantially equal to or less than about 10,000 Å. When the metal pattern 400 is less than about 100 Å, the metal pattern 400 might not have a substantially uniform thickness. Furthermore, the metal pattern 400 may not sufficiently protect the first electrode 710 during a manufacturing process. When the metal pattern 400 is greater than about 10,000 Å thick, it may be difficult to pattern the metal pattern 400 during a manufacturing process.

The pixel definer 300 may be provided to cover a side end portion of the first electrode 710 and a side end portion of the metal pattern 400. In addition, the pixel definer 300 may define a pixel area by surrounding the first electrode 710 along the edge of the first electrode 710. The pixel definer 300 may include an opening 305. The opening of the pixel definer 300 may overlap the first electrode 710. A region of the first electrode 710 not covered by the pixel definer 300 and exposed by the opening 305 may be defined to be the pixel area. The pixel definer 300 may include a photosensitive organic material. For example, the pixel definer 300 may include one of an olefin-based organic material, an acryl-based organic material, and an imide-based organic material.

The organic layer 720 may be provided on the first electrode 710 exposed by the pixel definer 300. The organic layer 720 may include an organic emission layer. The organic layer 720 may further include at least one of a hole injection layer, a hole transport layer, an electron transport layer, and an electron injection layer. Electron and holes may be coupled with each other in the organic emission layer to generate an exciton. Therefore, light may be emitted by energy generated when the exciton falls from an excited state to a ground state.

The second electrode 730 may be provided on the organic layer 720 and the pixel definer 300. The second electrode 730 may be provided in common for a plurality of pixel areas. The second electrode 730 may be a cathode. The cathode may be an electron injection electrode and may have a characteristic of light reflection, light semi-transmission, or light transmission. For example, the second electrode 730 may include a metal oxide such as an indium tin oxide (ITO), indium zinc oxide (IZO), zinc oxide (ZnO), or indium(III) oxide ($In_2O_3$). Alternatively, the second electrode 730 may include a metal such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), LiF/Ca, or LiF/Al, or an alloy thereof. The second electrode 730 may include a single layer or multiple layers. In a multiple layer structure, a plurality of layers may be stacked.

The second substrate 200 may be provided on an organic light-emitting diode 700. The organic light-emitting diode 700 may include a first electrode 710, an organic layer 720, and a second electrode 730. The second substrate 200 may be provided to protect the organic light-emitting diode 700. The second substrate 200 may be an insulating substrate including glass, quartz, ceramic, or plastic. The second substrate 200 may also be a flexible substrate, a stretchable substrate, or a rollable substrate. The flexible substrate, the stretchable substrate, and the rollable substrate may include an organic material such as a polyimide (PI), polycarbonate (PC), polyethylene (PE), polyethylene terephthalate (PET), or polyacrylate.

The organic light-emitting device 1000 according to an exemplary embodiment of the present invention may be manufactured when the pixel definer material layer 30 undergoes a dry etching process while the first electrode 710 is protected by the metal layer 40. Therefore, the first electrode 710 might not be damaged and the defects of images and deterioration of lifespan of the organic light-emitting device 1000 might not occur. The pixel definer 300 may be generated to cover the metal pattern 400 and the end portion of the first electrode 710. Therefore, a short circuit between electrodes may be prevented. A part of the pixel definer material layer 30 may be melted by a heat treatment and may flow downward to generate the pixel definer 300. Accordingly, an upper surface of the pixel definer 300 may be formed to have a curved shape. When the second electrode 730 is thin, the second electrode 730 may be prevented from being short circuited by the angulated portion of the pixel definer 300.

Figure 12:
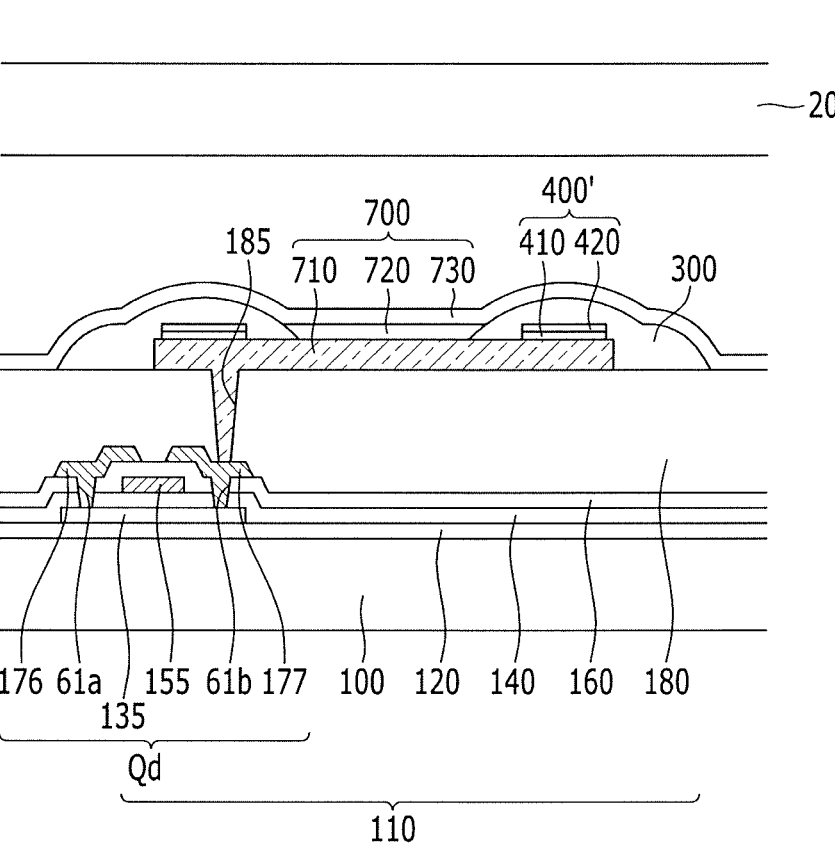
FIG. 12 illustrates an organic light-emitting device according to an exemplary embodiment of the present invention.

FIG. 12 illustrates a cross-sectional view of an organic light-emitting device according to an exemplary embodiment of the present invention.

As illustrated in FIG. 12, a metal pattern 400' of the organic light-emitting device 1001 may have a stacked configuration. The stacked configuration may include a first metal pattern 410 and a second metal pattern 420.

The first metal pattern 410 may include a metal such as titanium (Ti). The second metal pattern 420 may include a metal such as aluminum (Al). Further, an additional layer of titanium (Ti) may be provided on the second metal pattern 420. However, embodiments of the present invention are not limited thereto.

The metal pattern 400' may be generated from patterning a metal layer with a stacked configuration used in a process for manufacturing the organic light-emitting device 1001. The metal pattern 400' may protect the first electrode 710 by the metal layer with a stacked configuration. Therefore, damage to the first electrode 710 may be prevented, defects of images may be suppressed, and deterioration of lifespan of the organic-light emitting diode 700 may be increased.

Figure 13:
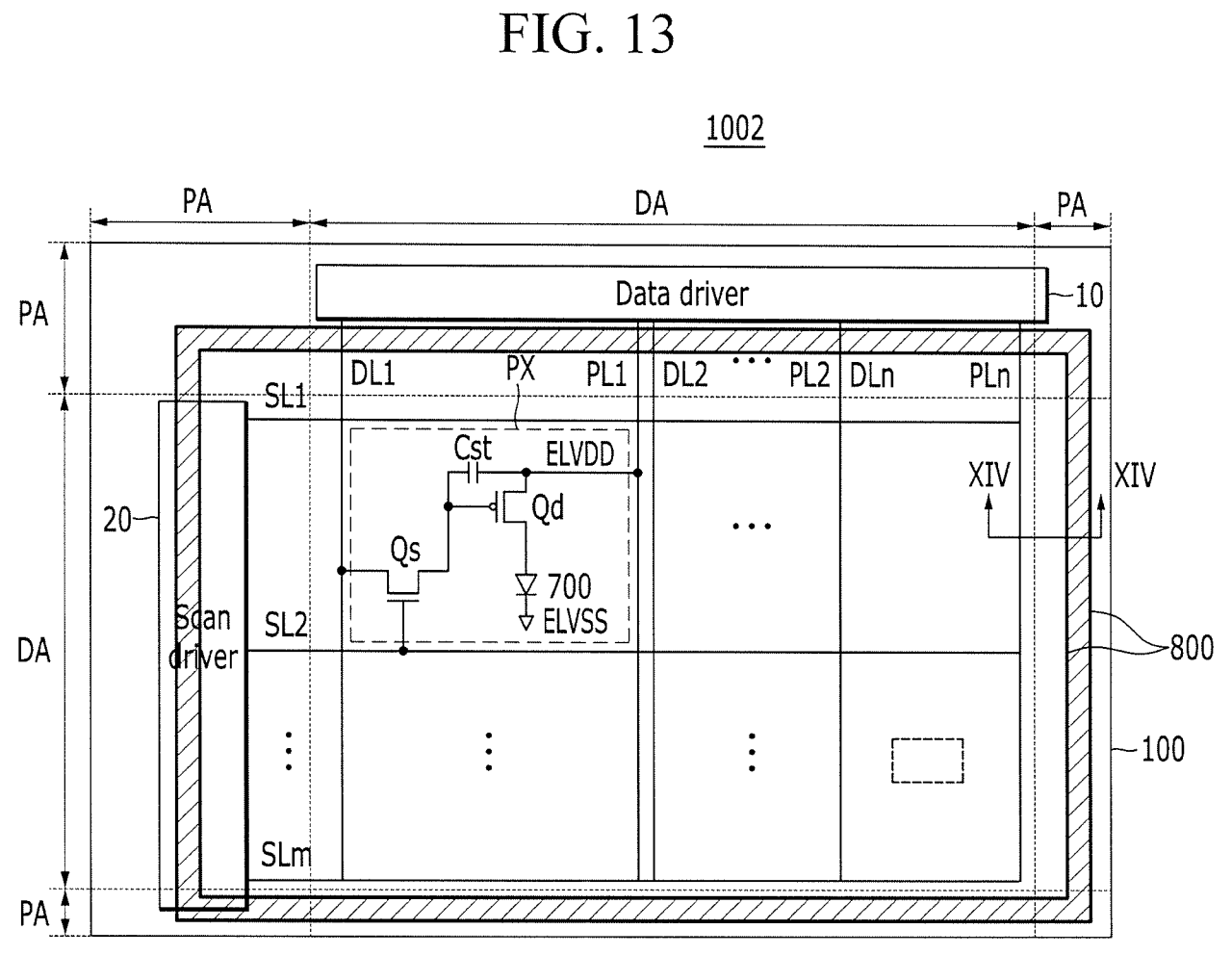
Figure 14:
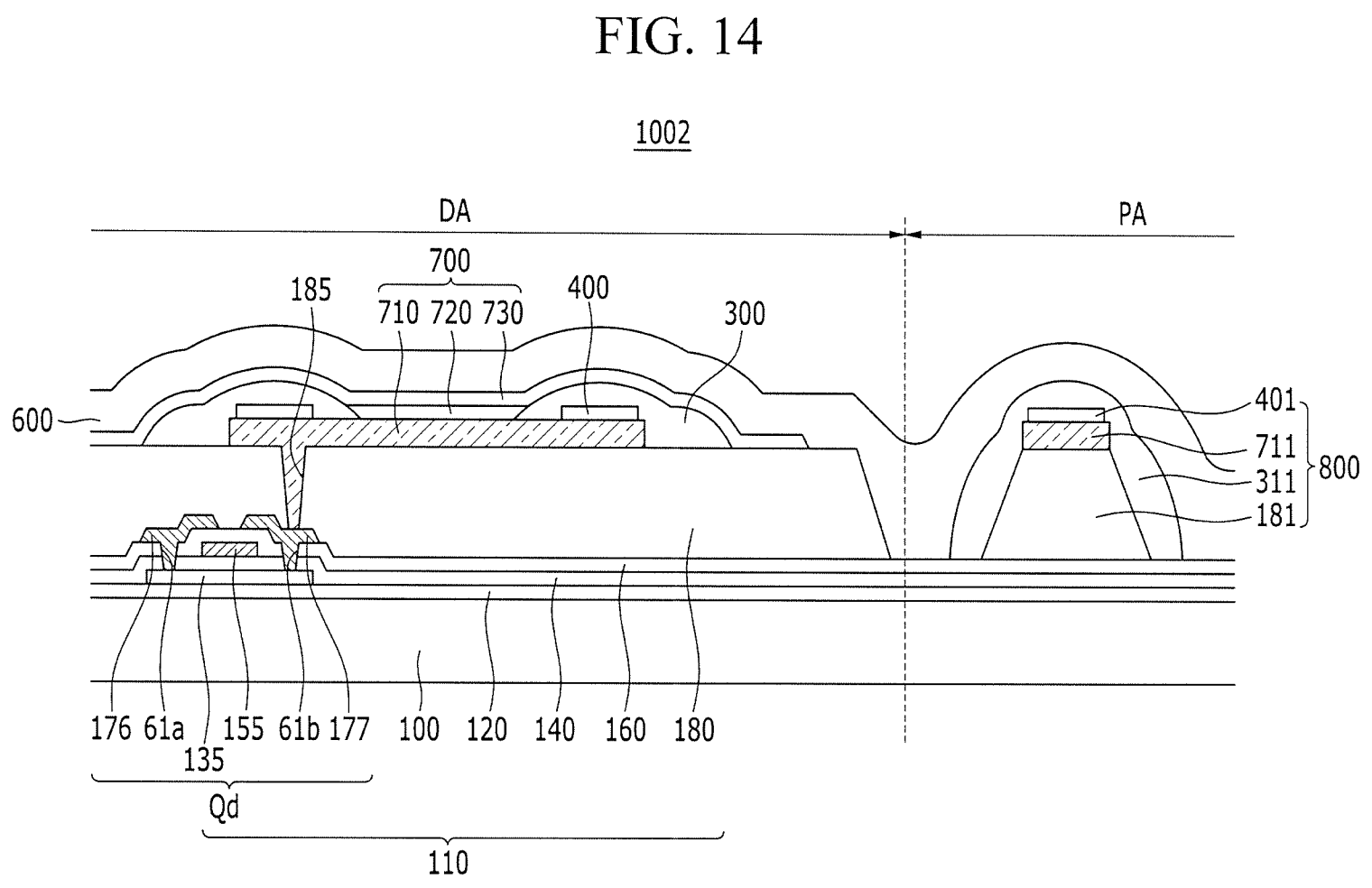

FIGS. 13 and 14 illustrate an organic light-emitting device according to an exemplary embodiment of the present invention. FIG. 13 illustrates a top plan view of an organic light-emitting device according to an exemplary embodiment of the present invention. FIG. 14 illustrates a cross-sectional view of an organic light-emitting device with respect to a line XIV-XIV of FIG. 13 according to an exemplary embodiment of the present invention.

Referring to FIGS. 13 and 14, the organic light-emitting device 1002 may include a display area DA and a peripheral area PA. The peripheral area PA may surround the display area DA. The peripheral area PA may be provided on an edge of the first substrate 100. The display area DA may include a plurality of organic light-emitting diodes 700. The peripheral area PA may include a dam portion 800. The display area DA and the peripheral area PA may include a thin film encapsulation layer 600. The thin film encapsulation layer 600 may cover the organic light-emitting diode 700. The thin film encapsulation layer 600 may also cover the dam portion 800.

According to an exemplary embodiment of the present invention, the first substrate 100 may include an organic material such as polyethylene terephthalate (PET), polyimide (PI), polycarbonate (PC), epoxy, polyethylene (PE), or polyacrylate. The first substrate 100 may be flexible, stretchable, foldable, bendable, or rollable. Therefore, the organic light-emitting device 1002 may be flexible, stretchable, foldable, bendable, or rollable.

Referring to FIG. 11, the dam portion 800 provided near the peripheral area PA may include a planarization pattern 181, a first electrode pattern 711, a peripheral area metal pattern 401, and a pixel definer pattern 301. The planarization pattern 181 may include a substantially similar material as the planarization layer 180 provided in the display area DA. The first electrode pattern 711, the peripheral area metal pattern 401, and the peripheral area pixel definer 311 may include substantially similar material as the first electrode 710, the metal pattern 400, and the pixel definer 300. The dam portion 800 may prevent a material with high fluidity from overflowing when the material with high fluidity is coated during the manufacturing process of the organic light-emitting device 1002. Furthermore, the thin film encapsulation layer 600 and the dam portion 800 may prevent external moisture and oxygen from permeating into the organic light-emitting diode 700.

The thin film encapsulation layer 600 may be generated to cover the organic light-emitting diode 700 and the dam portion 800 throughout the display area DA and the peripheral area PA. The thin film encapsulation layer 600 may seal the organic light-emitting diode 700 from an external environment, including moisture and oxygen. Therefore, the thin film encapsulation layer 600 may prevent the organic light-emitting diode 700 from being degraded and damaged by moisture and oxygen. The thin film encapsulation layer 600 may be provided with a configuration in which a plurality of organic films and a plurality of inorganic films are alternately stacked; however, exemplary embodiments of the present invention are not limited thereto.

FIGS. 15 to 18 illustrate a method of manufacturing an organic light-emitting device according to an exemplary embodiment of the present invention.

Figure 15:
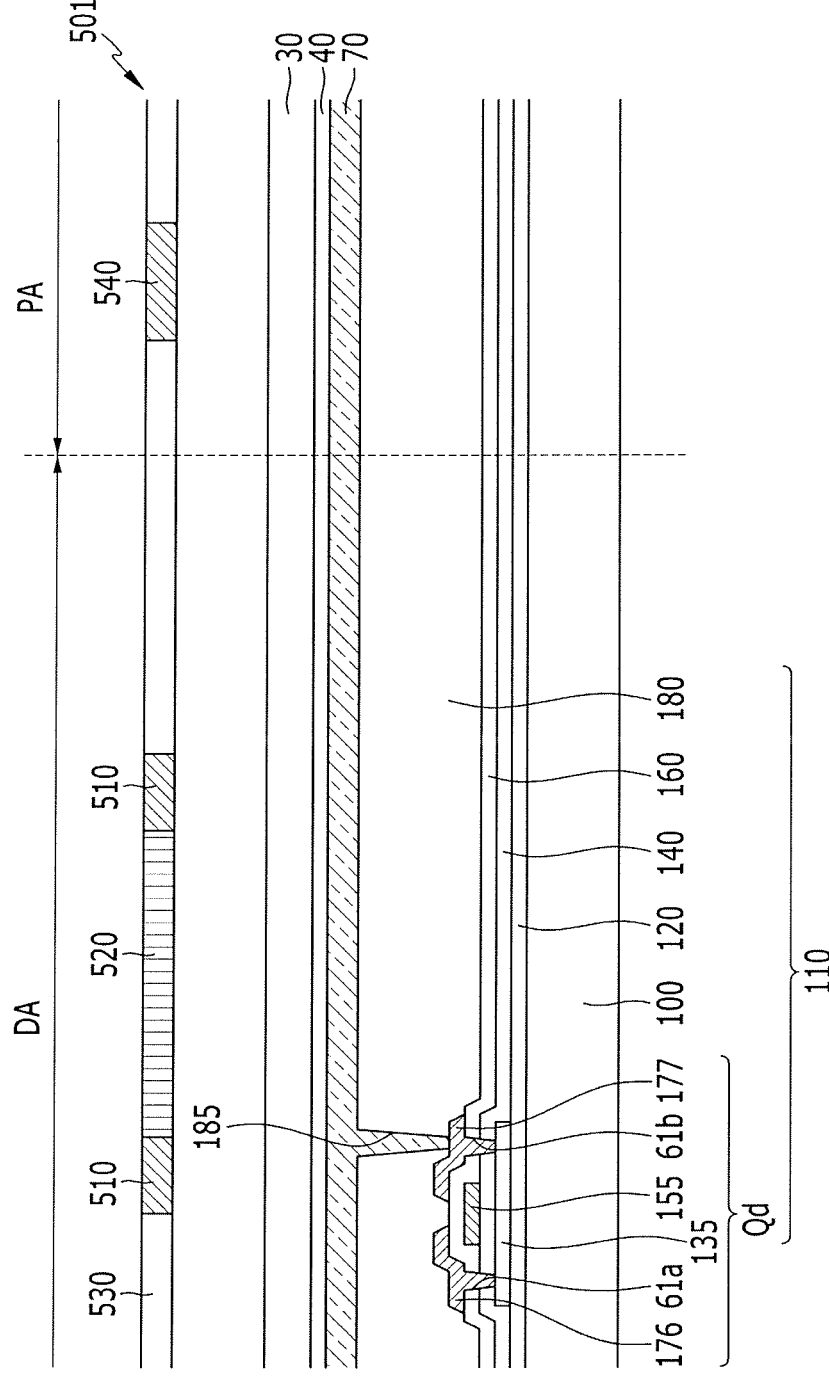
FIGS. 15 to 18 illustrate a method of manufacturing an organic light-emitting device according to an exemplary embodiment of the present invention.
Figure 16:
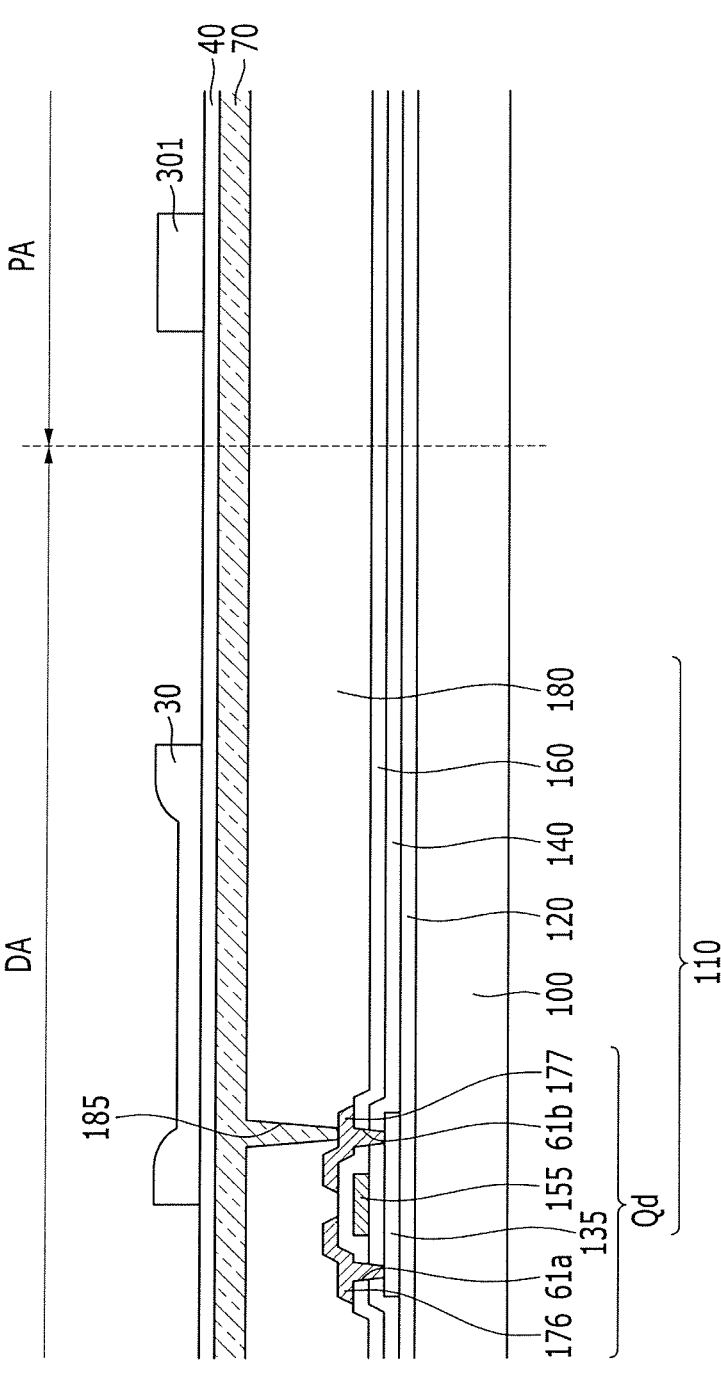

Referring to FIGS. 15 and 16, a first electrode material layer 70, a metal layer 40, and a pixel definer material layer 30 may be sequentially generated on a first substrate 100 where a circuit portion 110 may be generated. The pixel definer material layer 30 may be partly removed, the pixel definer material layer 30 may be substantially entirely removed, or the pixel definer material layer 30 might not be removed depending on a region by using a halftone mask 501.

As illustrated in FIG. 15, the pixel definer material layer 30 may be exposed by use of the halftone mask 501. The halftone mask 501 may include a light blocker 510. The light blocker 510 may block substantially all light. The halftone mask 501 may also include a first light transmitter 520. The first light transmitter 520 may transmit a portion of light. For example, the first light transmitter 520 may transmit about 50% of light. The halftone mask 501 may further include a second light transmitter 530. The second light transmitter 530 may transmit substantially all light. For example, the second light transmitter 530 may transmit about 100% of light. The halftone mask 501 may be disposed so that the light blocker 510 may correspond to a region where the pixel definer 300 may be provided, the first light transmitter 520 may correspond to a region where the first electrode material layer 70 may remain to become the first electrode 710, and the second light transmitter 530 may correspond to a region where the first electrode material layer 70 and the metal layer 40 may be removed. The halftone mask 501 may further include a peripheral light blocker 540. The peripheral light blocker 540 may correspond to a portion of forming the dam portion 800 of the peripheral area PA. The peripheral light blocker 540 may have substantially the same transmittance as the light blocker 510. Accordingly, the peripheral light blocker 540 may block substantially all light.

As illustrated in FIG. 16, the pixel definer material layer 30 may be substantially entirely removed from the portion exposed to substantially all light transmitted by the second light transmitter 530 to expose the metal layer 40. The pixel definer material layer 30 may remain in the portion from which substantially all light is blocked by the light blocker 510 and the peripheral light blocker 540. Additionally, the pixel definer material layer 30 may remain where substantially all light is blocked. A part of the pixel definer material layer 30 may be removed in the thickness direction in the portion where about 50% of the light is transmitted by the first light transmitter 520. The pixel definer pattern 301 made of the pixel definer material may be provided corresponding to the portion where the dam portion 800 of the peripheral area PA is formed.

Figure 17:
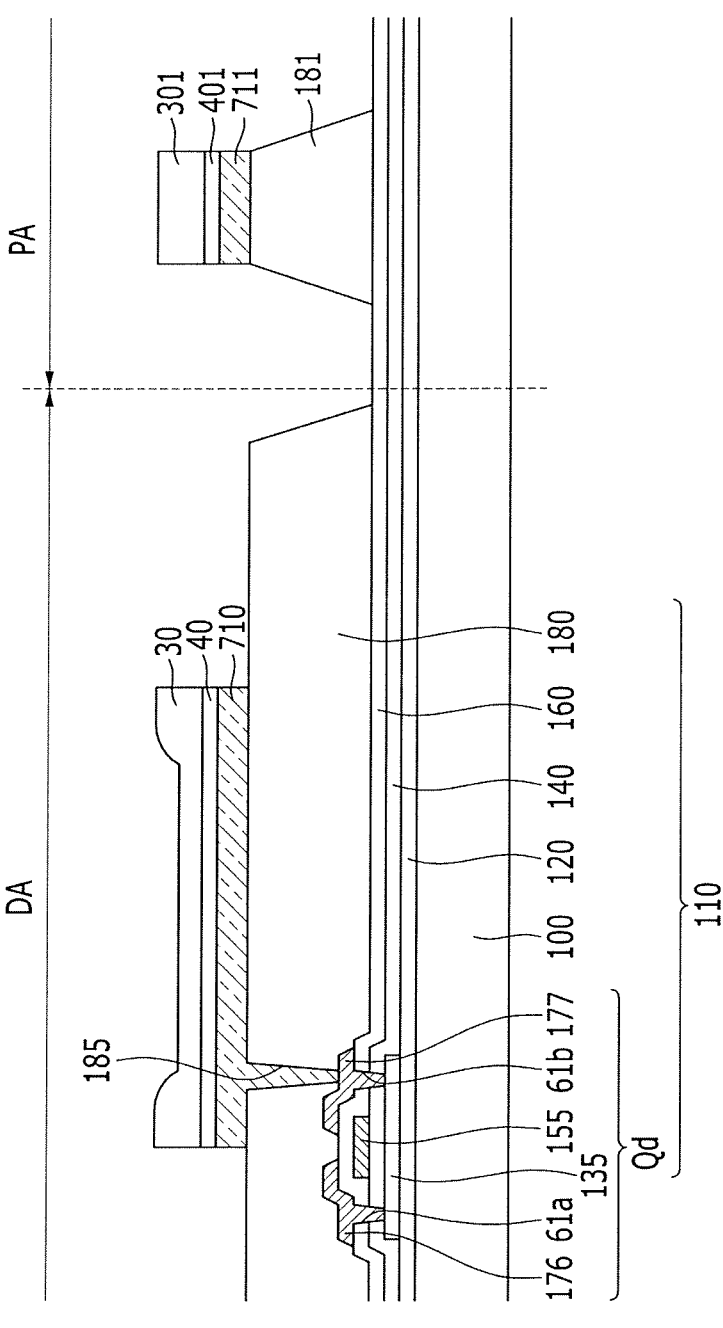

As illustrated in FIG. 17, the first electrode material layer 70 and the metal layer 40 may be removed corresponding to the portion where substantially the entire pixel definer material layer 30 is removed.

The metal layer 40 and the first electrode material layer 70 may be removed by wet etching using the pixel definer material layer 30 and the pixel definer pattern 301 as a mask. As illustrated in FIG. 17, the form of the first electrode 710 may be manufactured. Regarding the peripheral area PA, the metal layer 40 of the region excluding the portion corresponding to the dam portion 800 and the peripheral light blocker 540 and the first electrode material layer 70 may be removed with the pixel definer pattern 301 as a mask. As such, a stacked configuration of a peripheral area metal pattern 401 may be provided on an upper side of the dam portion 800, the first electrode pattern 711, and the pixel definer pattern 301. A planarization layer 180 may be etched with the pixel definer material layer 30 as a mask. As such, a planarization pattern 181 may be provided on a lower side of the dam portion 800. According to an exemplary embodiment of the present invention, the planarization pattern 181 may be generated by patterning the entire planarization layer 180. Additionally, a part of the planarization layer 180 may be patterned in the thickness direction and may be used as the planarization layer pattern 181.

Figure 18:
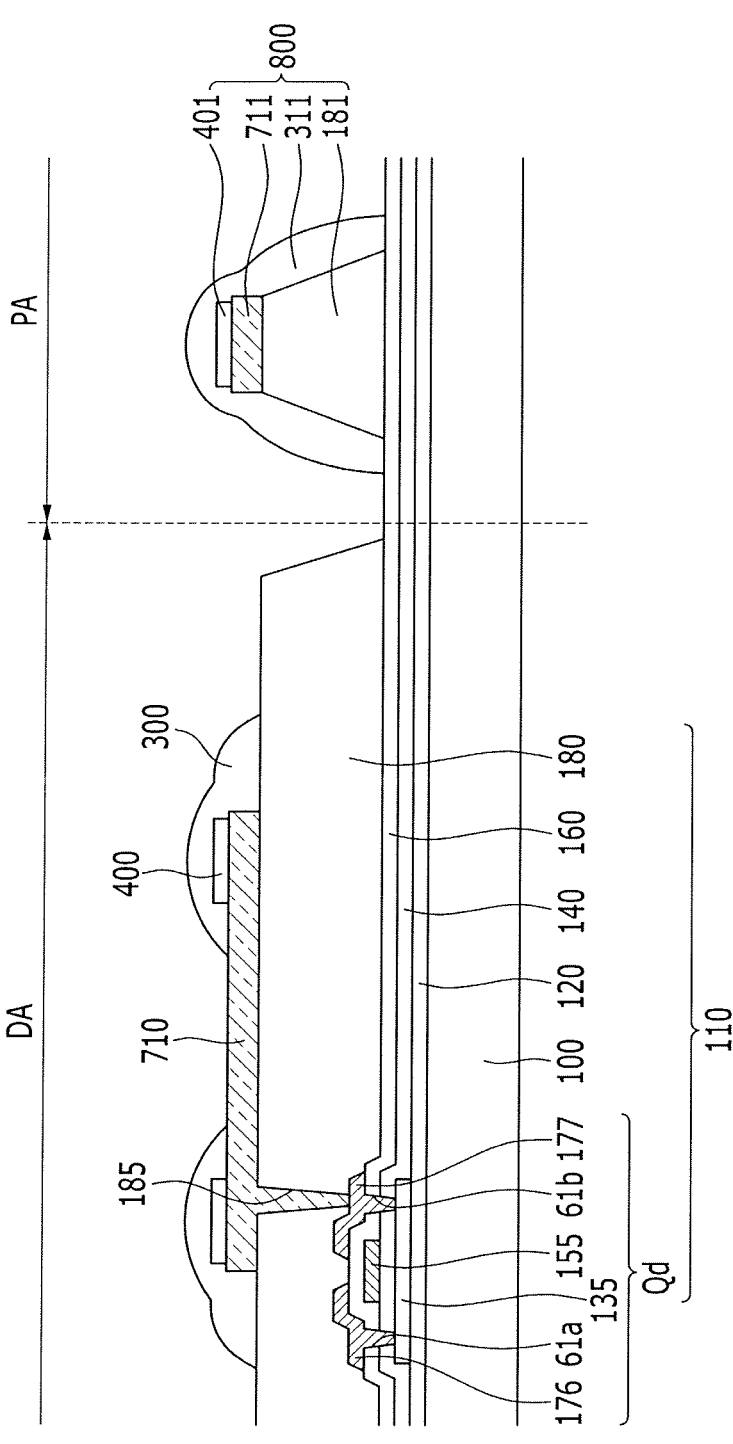

As illustrated in FIG. 18, the metal layer 40 of the portion exposed by the pixel definer material layer 30 may be removed by wet etching to expose the first electrode 710. The remaining pixel definer material layer 30 and the pixel definer pattern 301 may be heat-treated to generate a pixel definer 300. Accordingly, the dam portion 800 is provided.

The metal layer 40 may be removed by using a first etchant that has an etching selection ratio for the metal layer 40. The portion covered by the pixel definer material layer 30 may include the metal layer 40 to generate a metal pattern 400. A side end portion of the metal pattern 400 and a side end portion of the peripheral area metal pattern 401 may be exposed to the first etchant. Therefore, the side end portion of the first electrode 710 and the side end portion of the first electrode pattern 711 may be further etched. As illustrated in FIG. 18, the side end portion of the metal pattern 400 and the side end portion of the peripheral area metal pattern 401 may be provided to have a shape that is increasingly caved in at the internal side than the side end portion of the first electrode 710 and the side end portion of the first electrode pattern 711.

The pixel definer material layer 30 and the pixel definer pattern 301 may be heat-treated to generate a pixel definer 300. Therefore, the dam portion 800 may be provided. By heating the pixel definer material layer 30 and the pixel definer pattern 301, as illustrated in FIG. 18, a part of the pixel definer material layer 30 and a part of the pixel definer pattern 301 may be melted and flow to the peripheral area PA. The melted part of the pixel definer material layer 30 and the melted part of the pixel definer pattern 301 may harden to generate a pixel definer 300 and a peripheral area pixel definer 311. Particularly, when the pixel definer pattern 301 is melted to cover the lower surface of the dam portion 800 where the planarization pattern 181 is generated, the peripheral area pixel definer 311 may be generated. Accordingly, permeation of external moisture and oxygen into the organic light emitting diode 700 may be prevented by the dam portion 800.

The dam portion 800 may be provided without an additional process since the metal layer 40 of the region excluding the portion corresponding to the dam portion 800 of the peripheral area PA and the first electrode material layer 70 are removed during the process for removing the metal layer 40 and the first electrode material layer 70 of the display area DA with the pixel definer material layer 30 as a mask.

According to the organic light-emitting device 1002 and the method of manufacturing the organic light-emitting device 1002 according to exemplary embodiments of the present invention, the dam portion 800 of the peripheral area PA may be provided with a simplified process. Therefore, the material with high fluidity may be prevented from overflowing by the dam portion 800 when it is coated during the process for manufacturing the organic light-emitting device 1002. Further, permeation of external moisture and oxygen into the organic light emitting diode 700 may be efficiently blocked by the dam portion 800 and the thin film encapsulation layer 600.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the present inventive concept.

What is claimed is:

1. A method of manufacturing an organic light-emitting display device, the method comprising:

disposing a first electrode material layer, a metal layer, and a pixel definer material layer on a planarization layer in a display area including a plurality of pixels and a peripheral area surrounding the display area of a substrate;

disposing a first electrode in the display area and a first electrode pattern in a dam portion in the peripheral area by patterning the first electrode material layer and the planarization layer using a halftone mask, the halftone mask including a first region, a second region, a third region, and a fourth region;

removing a portion of the pixel definer material layer remaining on the first electrode to expose the metal layer;

removing the metal layer exposed by the removed portion of the pixel definer material layer to generate a metal pattern provided along an edge of the first electrode and a peripheral area metal pattern on the first electrode pattern; and disposing a pixel definer and a peripheral area pixel definer by heat treating the pixel definer material layer remaining on the first electrode, the metal pattern, the first electrode pattern, and the peripheral area metal pattern, wherein the pixel definer material layer is used as a mask to both form the first electrode by etching the first electrode material layer and to form the metal pattern by etching the metal layer, wherein a part of the pixel definer material layer is melted by the heat treatment to generate a pixel definer, wherein the pixel definer directly and entirely covers a top and directly and entirely covers all side surfaces of the metal pattern and an end portion of the first electrode while exposing a center portion of the first electrode, wherein the peripheral area pixel definer directly and entirely covers a top and directly and entirely covers all side surfaces of the peripheral metal pattern, side surfaces of the first electrode pattern disposed below the peripheral metal pattern, side surfaces of the planarization pattern disposed below the first electrode pattern, and a top surface of an interlayer insulating layer disposed below the planarization pattern, wherein the metal layer is etched to a greater extent than the first electrode so as to generate a step-shape and the step-shape is covered by the pixel definer, created from the pixel definer material layer used as a mask to form the first electrode and the metal pattern, the pixel definer covering the step-shape as a result of the pixel definer material layer being melted by the heat treatment, and wherein the step-shape is generated by a side end portion of the metal pattern provided near a side end portion of the first electrode with the side end portion of the first electrode, wherein disposing a first electrode in the display area and a dam portion in the peripheral area includes:

retaining the pixel definer material layer corresponding to the first region and the fourth region, removing a part of the pixel definer material layer corresponding to the second region in a thickness direction, and removing substantially the entire pixel definer material layer corresponding to the third region; and removing the metal layer and the first electrode material layer corresponding to the third region, wherein the fourth region has substantially a same transmittance as the first region, wherein the dam portion corresponds to the fourth region, and wherein the first region of the halftone mask is a light blocker, the second region of the halftone mask is a first light transmitter, the third region of the halftone mask is a second light transmitter, and the fourth region of the halftone mask is a peripheral light blocker that is disposed within the peripheral area.

2. The method of claim 1, wherein the removing of the portion of the pixel definer material layer includes dry etching the pixel definer material layer, and wherein the removing of the metal layer includes wet etching the metal layer.

3. The method of claim 1, wherein the metal layer has an etching selection ratio that is different from an etching selection ratio of the first electrode material layer.

4. The method of claim 3, wherein the removing of the metal layer and the first electrode material layer corresponding to the third region includes removing the metal layer prior to removing the first electrode material layer.

5. The method of claim 1, wherein the heat treatment is performed at a temperature that is substantially equal to or greater than about 200° C. and less than about 400° C.

* * * * *